United States Patent
Sasajima et al.

(10) Patent No.: US 9,104,913 B2
(45) Date of Patent: Aug. 11, 2015

(54) PATTERN MEASURING METHOD, PATTERN MEASURING APPARATUS, AND PROGRAM USING SAME

(75) Inventors: Fumihiro Sasajima, Hitachinaka (JP); Yoshihiro Kimura, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 125 days.

(21) Appl. No.: 13/882,147

(22) PCT Filed: Oct. 14, 2011

(86) PCT No.: PCT/JP2011/005747
§ 371 (c)(1),
(2), (4) Date: Apr. 26, 2013

(87) PCT Pub. No.: WO2012/056638
PCT Pub. Date: May 3, 2012

(65) Prior Publication Data
US 2013/0216121 A1    Aug. 22, 2013

(30) Foreign Application Priority Data
Oct. 27, 2010  (JP) .................................. 2010-240248

(51) Int. Cl.
*G06K 9/00* (2006.01)
*H01J 37/28* (2006.01)
(Continued)

(52) U.S. Cl.
CPC ........ *G06K 9/00523* (2013.01); *G03F 7/70625* (2013.01); *H01J 37/28* (2013.01);
(Continued)

(58) Field of Classification Search
CPC ............. G06T 2207/30148; G06T 7/001; G06T 7/0004; G06K 9/4638; G06K 9/00
USPC .................. 382/145, 141, 149, 204
See application file for complete search history.

(56) References Cited

U.S. PATENT DOCUMENTS

| 7,888,638 B2 | 2/2011 | Miyamoto et al. |
| 2009/0231424 A1* | 9/2009 | Honda et al. .................... 348/87 |

(Continued)

FOREIGN PATENT DOCUMENTS

| JP | 62-237307 | 10/1987 |
| JP | 2003-109002 A | 4/2003 |
| JP | 2006-318955 A | 11/2006 |
| JP | 2007-192753 A | 8/2007 |
| JP | 2009-243993 A | 10/2009 |

OTHER PUBLICATIONS

International Search Report issued in International Patent Application No. PCT/JP2011/005747 dated Nov. 29, 2011.

*Primary Examiner* — Ruiping Li
(74) *Attorney, Agent, or Firm* — McDermott Will & Emery LLP

(57) ABSTRACT

In measuring pattern with large process fluctuation, correct measurement cannot be carried out if noises, such as pattern that is not the subject to be measured, and dirt, are present in periphery of pattern to be measured in previously registered measurement region. Among the image data of sample, predetermined region aligned by pattern matching is set as region not to be measured that is excluded from subjects of pattern measurement. For example, in measuring pattern with large process fluctuation, only region including pattern with small process fluctuation is used in pattern matching, while in measuring the pattern, predetermined region, which was used in pattern matching and aligned, is set as region not to be measured. Stable pattern measurement can be easily carried out with respect to pattern with large process fluctuation, without being affected by region where measurement region and region not to be measured overlap with each other.

10 Claims, 17 Drawing Sheets

(51) Int. Cl.
*G03F 7/20* (2006.01)
*H01L 21/66* (2006.01)

(52) U.S. Cl.
CPC ............ *H01J2237/24578* (2013.01); *H01J 2237/24592* (2013.01); *H01J 2237/2817* (2013.01); *H01L 22/12* (2013.01); *H01L 2924/0002* (2013.01)

(56) References Cited

U.S. PATENT DOCUMENTS

2009/0238443 A1* 9/2009 Sato et al. .................. 382/145
2010/0202654 A1* 8/2010 Matsuoka et al. ........... 382/100

* cited by examiner

FIG.2
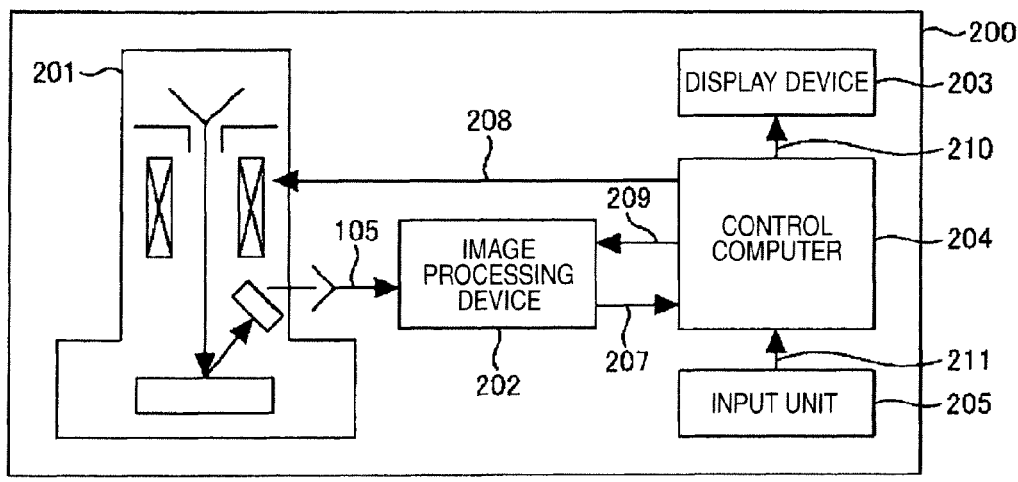
FIG.3-A
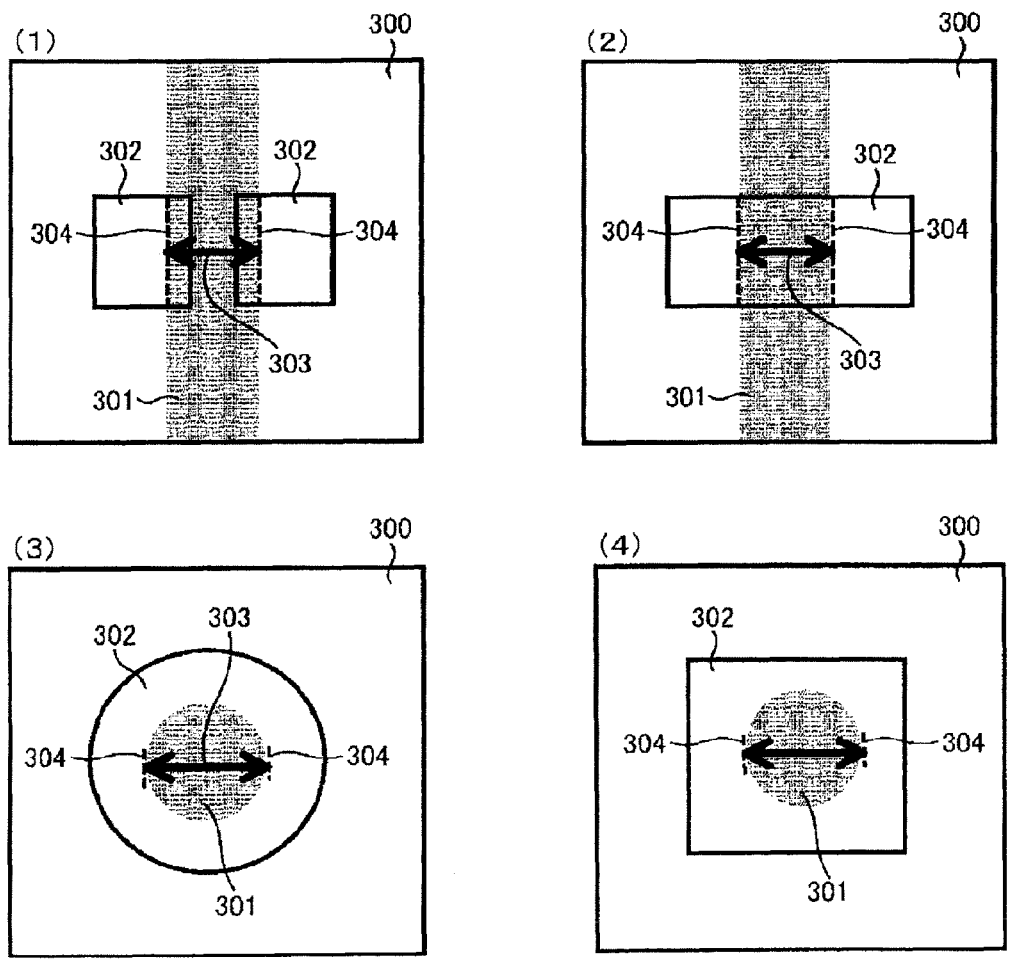

FIG.3-B
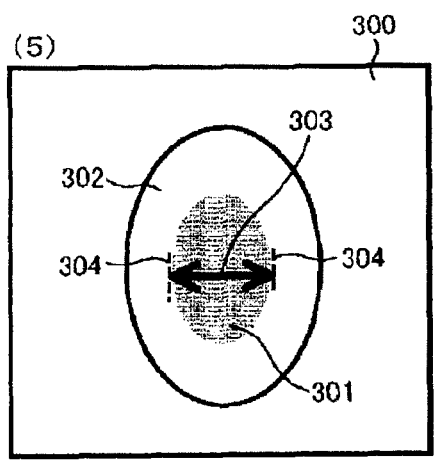
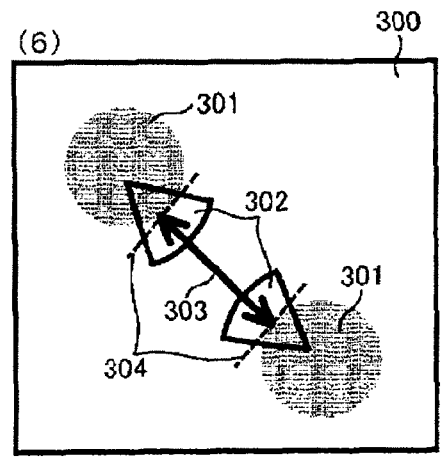
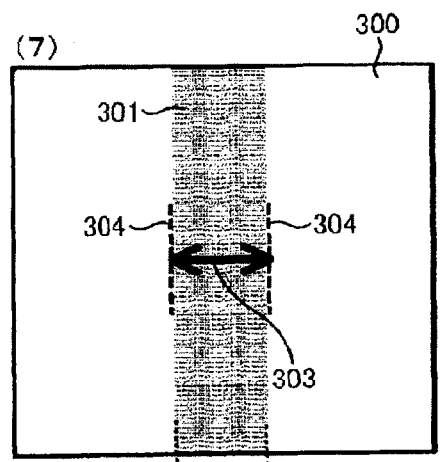

FIG.8
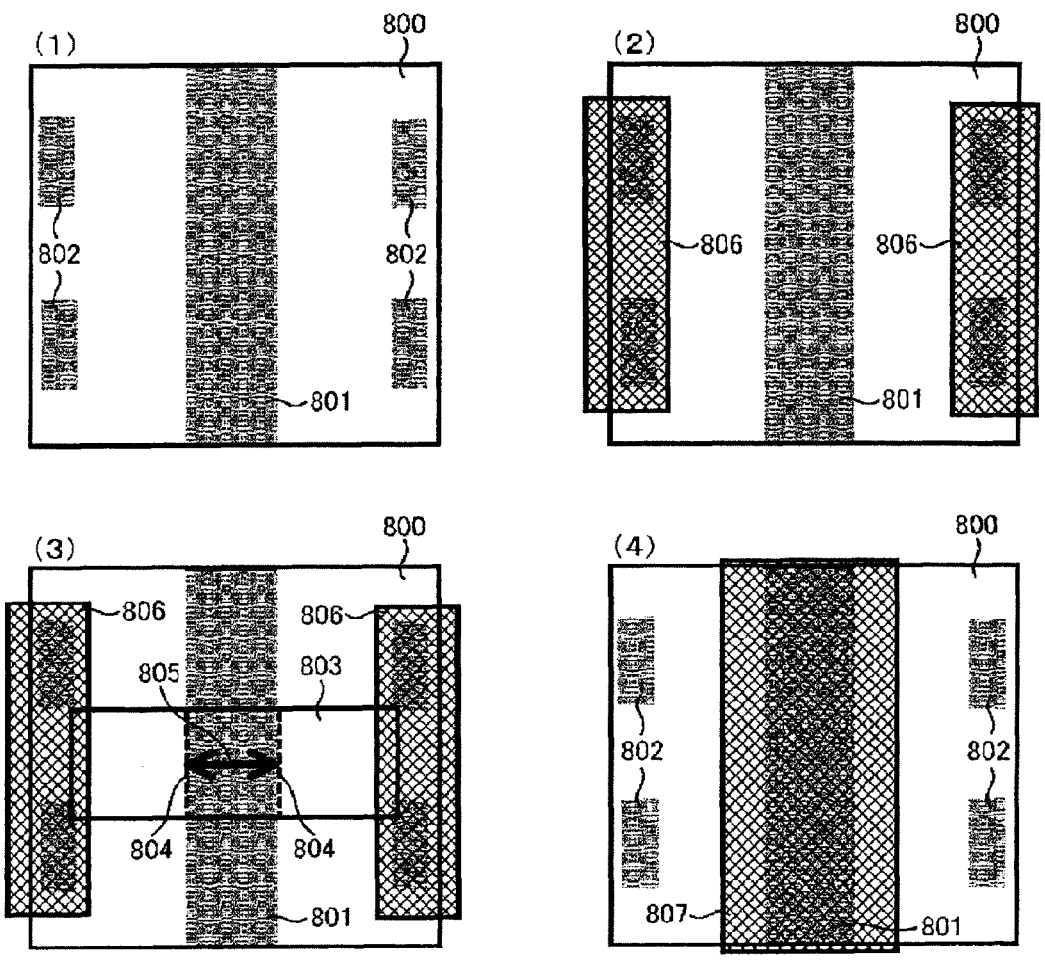
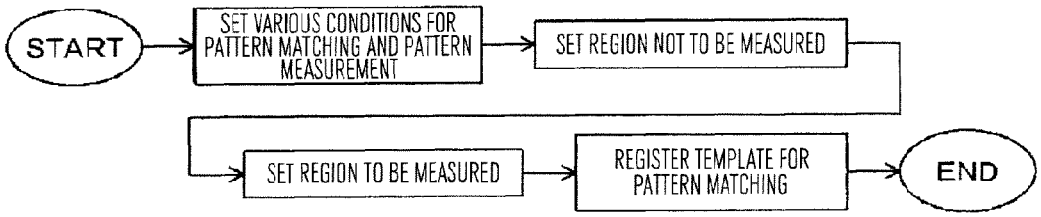

FIG.12-A
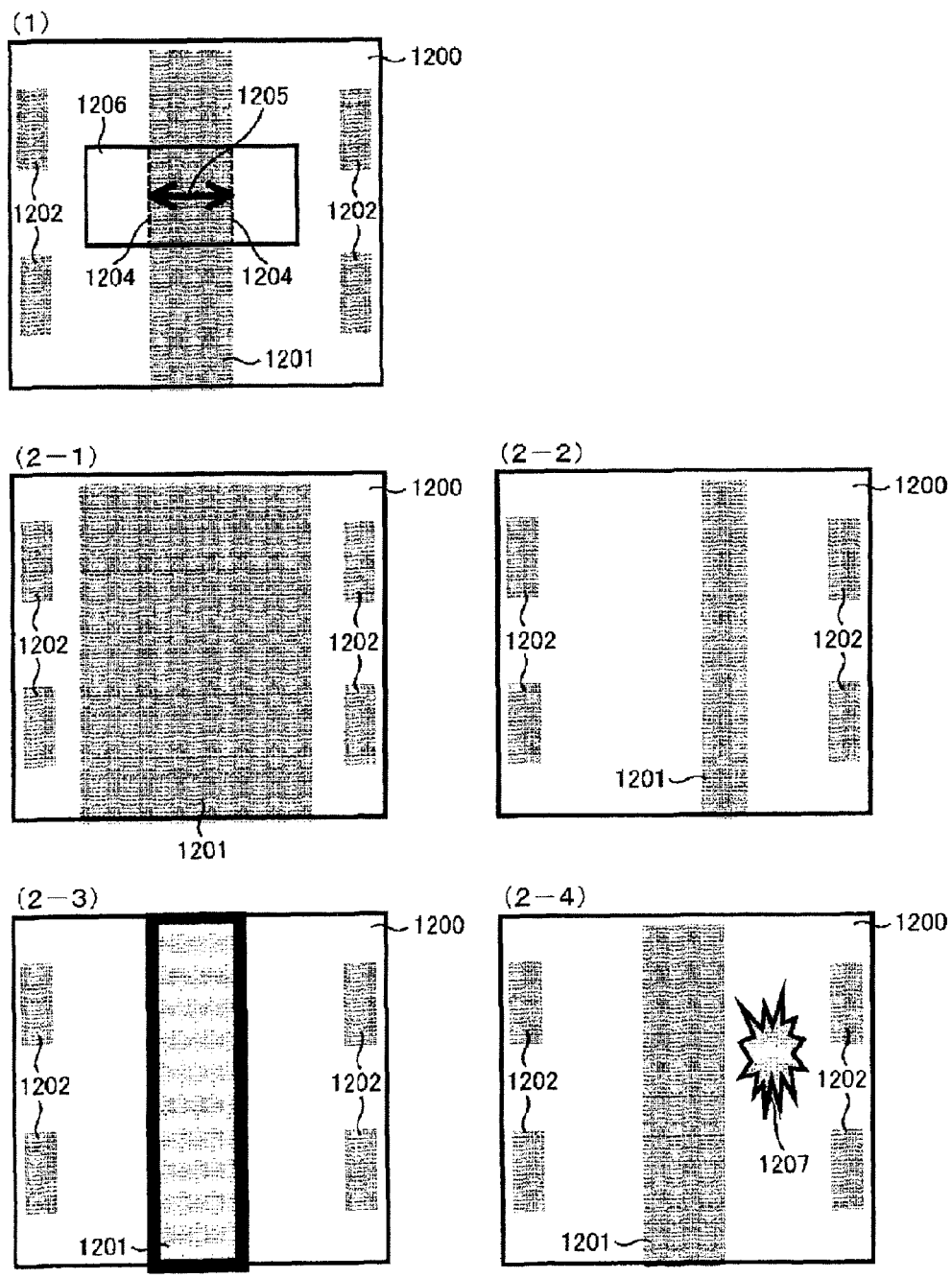

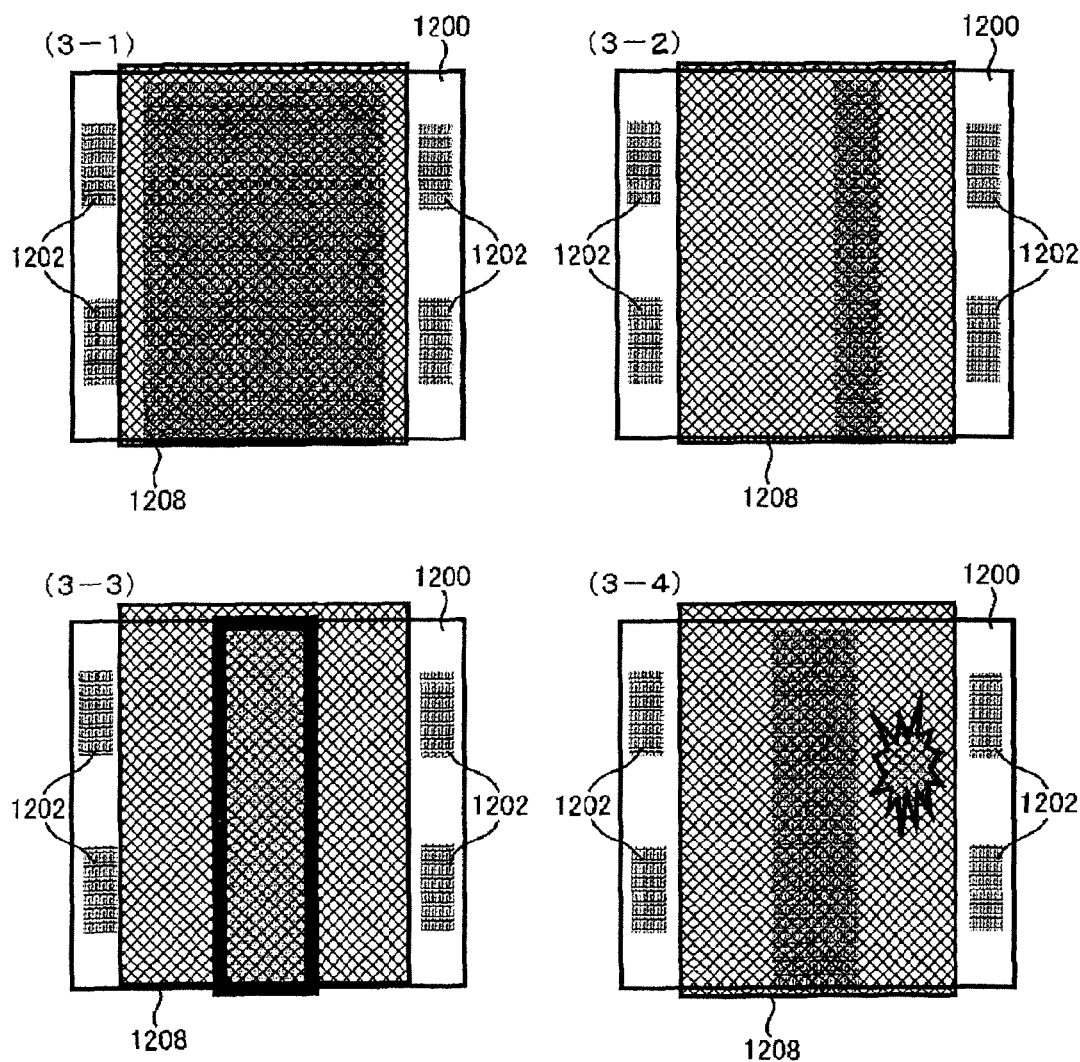
FIG.12-B

PATTERN MEASURING METHOD, PATTERN MEASURING APPARATUS, AND PROGRAM USING SAME

RELATED APPLICATIONS

This application is the U.S. National Phase under 35 U.S.C. §371 of International Application No. PCT/JP2011/005747, filed on Oct. 14, 2011, which in turn claims the benefit of Japanese Application No. 2010-240248, filed on Oct. 27, 2010, the disclosures of which Applications are incorporated by reference herein.

TECHNICAL FIELD

The present invention relates to pattern measuring apparatuses, pattern measuring methods, and pattern measuring programs suitable for a semiconductor inspection system.

BACKGROUND ART

In recent years, with an increase in integration of semiconductor elements and a reduction in size of a semiconductor element, a technique for quickly and accurately inspecting a fine pattern becomes important. From such a background, with sophistication of an imaging device represented by an electron microscope and a video device, an image processing device has been put into practical use which has: a function to recognize a specific pattern included in an image, the image being obtained by imaging a sample with an imaging device, and the location thereof and carry out alignment between the specific pattern and a pattern on previously registered data (hereinafter, this function is referred to as "pattern matching"); and a function to measure the dimensions of a target pattern (hereinafter, this function is referred to as "pattern measurement").

Patent Literature 1 discloses an invention related to a method of precisely measuring a shape error, called a process fluctuation in a pattern forming step, between a pattern on an image of a sample and a pattern on previously registered data of the sample, wherein if the pattern measurement result is not appropriate, the size and/or location of a cursor are corrected.

Patent Literature 2 discloses a method including the steps of: when a pattern is measured by setting, imaging, and image-processing a target region including an edge of the pattern, calculating a shape difference between a pattern in a SEM image and a pattern in design data; based on this calculated information, specifying an inspection region with a measuring cursor; and managing the location and/or shape thereof as a measurement recipe, wherein if the location of the cursor is offset from the edge, the location of the cursor is shifted in accordance with the location of the edge so as to increase the distance between the edge and the cursor.

Patent Literature 3 discloses a method including the steps of: setting a mask region, which is excluded from a subject for pattern matching, in the image data of a sample; and if previously registered pattern data spans a target region and the mask region in the image data in a scanning stage, setting a processing condition based on the extent of overlapping with at least one of the target region and the mask region.

CITATION LIST

Patent Literature

Patent Literature 1: JP-A-2006-318955
Patent Literature 2: JP-A-2009-243993
Patent Literature 3: JP-A-2003-109002

SUMMARY OF INVENTION

Technical Problem

However, in Patent Literature 1 and Patent Literature 2, in correcting the size and/or location of a measuring cursor as the way to manage a process fluctuation occurring in the manufacture process of a sample, a case has not been taken into consideration at all, where noises, such as another pattern that is not a subject to be measured, and dirt, are present in the periphery of a pattern that is a subject to be measured. Therefore, in such a case, a problem in pattern measurement at a false location of a measuring cursor after the correction, the problem possibly being caused by noises, cannot be solved. Moreover, in Patent Literature 1, because the measuring cursor is adjusted after the measurement result of a pattern is obtained and the validity of this result is determined, a failure in pattern measurement due to a process fluctuation cannot be prevented.

Patent Literature 3 does not describe an association between setting a mask in a region to be excluded from subjects for pattern matching and the problem in pattern measurement at a false location due to the above-described corrected measuring cursor.

The present invention has been made in view of the above circumstances and provides a unit configured to precisely measure a pattern to be measured even when another pattern that is not a subject to be measured, dirt, and the like are present in the periphery of the pattern to be measured.

Solution to Problem

There are provided a pattern measuring apparatus, a method, and a program for: setting a measurement region in image data obtained by imaging a sample; carrying out pattern matching between the image data and previously stored pattern data; setting a predetermined region in the image data, the predetermined region being aligned by pattern matching, as a region excluded from subjects to be measured; and excluding a signal included in a region, where the measurement region and the predetermined region overlap with each other, and carrying out pattern measurement.

Advantageous Effects of Invention

According to the pattern measuring apparatus, method, and program of the present invention, even if another pattern that is not a subject to be measured, dirt, and the like are present in a measurement region, a region where a predetermined region set as a region not to be measured overlaps with a measurement region will not be affected by these pattern and dirt. Therefore, pattern measurement can be carried out precisely even when a process fluctuation occurs between image data obtained by imaging a sample and previously stored pattern data. Moreover, also in adjusting the size and/or location of a measuring cursor, this work can be simplified.

BRIEF DESCRIPTION OF DRAWINGS

FIG. 2 is the configuration diagram of a scanning electron microscope system with the pattern measuring apparatus of the present invention.

FIG. 3-A is the view showing an example of setting a measurement region with respect to various patterns.

FIG. 3-B is the view showing an example of setting a measurement region with respect to various patterns.

FIG. 8 shows an example of setting various conditions in inputting an imaging condition and a process flow in the present invention.

FIG. 12-A is the view showing an example of automatically setting a region not to be matched with respect to various patterns using an image set.

FIG. 12-B is the view showing an example of automatically setting a region not to be matched with respect to various patterns using an image set.

DESCRIPTION OF EMBODIMENTS

Hereinafter, embodiments of the present invention will be described with reference to the accompanying drawings. Note that each of the embodiments shown below is one example and the content of the present invention is not limited thereto.

Figure 1:
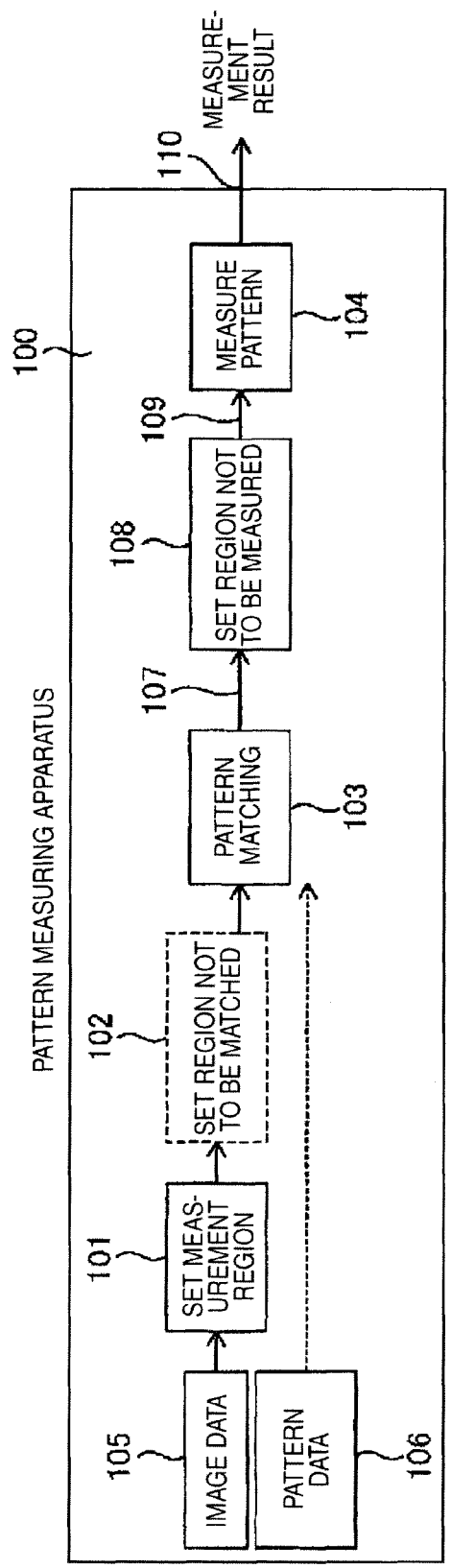
FIG. 1 is a block diagram showing a pattern measuring apparatus of the present invention.

FIG. 1 is a block diagram showing the basic configuration of a pattern measuring apparatus 100 of the present invention.

The pattern measuring apparatus of the present invention receives image data 105 (hereinafter, referred to as a SEM image) obtained by imaging a sample with an imaging device, such as a scanning electron microscope (hereinafter, referred to as a SEM) and previously stored pattern data 106 of the sample, and sets, to the image data 105, a measurement region using a measurement region setting unit 101, and carries out pattern matching between the image data 105 and the pattern data 106 using a pattern matching unit 103. At this time, the pattern measuring apparatus 100 may include a "region not to be matched" setting unit 102, as required, so as to set a region not to be matched. Next, from a pattern matching result 107, a predetermined region, which was used in alignment, among the image data 105 is set as a region to be excluded from measurement regions, by a "region not to be measured" setting unit 108. Then, a pattern measurement unit 104 extracting a signal included in the measurement region and measuring a pattern formed on the sample excludes a signal included in a region, where the measurement region and the predetermined region overlap with each other, in image data 109 after the setting, and carries out pattern measurement and outputs a pattern measurement result 110.

FIG. 2 is the schematic diagram of a configuration in which the pattern measuring apparatus 100 of the present invention is applied to an image processing device 202 of a scanning electron microscope system 200. The scanning electron microscope system 200 comprises: a SEM 201 capturing an image of a semiconductor device; an image processing device 202 that performs a processing for reducing a specific noise included in the image data 105 and a pattern measurement processing of the present invention; a control computer 204 that controls the SEM 201 and the image processing device 202; an input unit 205 configured to input control data 211 for controlling the scanning electron microscope system 200; and a display device 203 for displaying a captured image of the image data 105, an image processing result, and display data 210 for controlling the pattern measuring apparatus 100.

Hereinafter, the above-described respective devices constituting the system are described.

The control computer 204 controls the whole of the scanning electron microscope system 200, such as the setting of the imaging condition of the SEM 201, the inspection location of a semiconductor device, and the image processing function of the image processing device 202. The control computer 204 is an information processing device represented by a personal computer or the like. The control computer 204 comprises: a memory for storing the previously stored pattern data 106, the image data 105 of a sample, a program and the like for controlling the scanning electron microscope (hereinafter, referred to as SEM) 201 and the image processing device 202; a CPU executing the control program; a signal input IF for inputting image processing results 207, such as the image data 105 and a pattern matching value, from the image processing device 202; and a signal output IF for outputting image processing data 209, such as SEM control data 208 for controlling the SEM 201, the control data of the image processing device 202, and the image data 105, which are passed to the image processing function.

The input unit 205 is provided for an operator to instruct the control computer 204 to set the imaging condition of the SEM 201, the inspection location of a sample, the location of design data corresponding to the inspection location, and the image processing function, for example. The input unit 205 is a mouse or a keyboard coupled to the control computer 204.

The display device 203 displays the image data 105 captured by the SEM 201, a pattern matching value, the information on the inspection location on a semiconductor device, and the display data 210 of the SEM 201, the image processing device 202, the pattern-data 106, and the like. The display device 20 is an image display device, such as a CRT (Cathode Ray Tube) or a liquid crystal display, coupled to the control computer 204.

The SEM 201 irradiates a sample with an electron beam while raster-scanning the surface of the sample, detects secondary electrons and reflection electrons generated from the surface of the sample, and obtains the image data 105 of the sample by converting these electrons into brightness information after amplification. The image processing device 202 comprises: a memory for storing the image data 105, the pattern matching and pattern measurement results, and the image processing result; a CPU that controls an image processing program and the whole of the image processing according to an instruction from the control computer 204; hardware for carrying out image processing at high speed; and a signal output IF for transferring the image data 105 used in pattern matching and pattern measurement and the image processing data 209 of the image processing function to the control computer 204.

The pattern measuring apparatus 100 of the present invention can be realized by combining the hardware with the software processing utilizing the CPU.

[Setting Example of Measurement Region]

FIG. 3 shows an example of a typical method of setting, to a pattern to be measured 301 on image data 300, a measurement region 302 and a measurement location for calculating a measurement distance 303. For the measurement region 302, for example, a region including an edge location 304 to measure is set with a measuring cursor in the shape of rectangle, circle, square, or the like.

(1) of FIG. 3 shows an example, in which in measuring the measurement distance 303 between the edge locations 304 on both sides of the pattern to be measured 301 that is a line pattern, the measurement region 302 including the respective edges is specified with a rectangular measuring cursor.

(2) of FIG. 3 shows an example, in which in measuring the measurement distance 303 between the edge locations 304 on both sides of the pattern to be measured 301, the measurement region 302 is specified with one rectangular measuring cursor including the edges on both sides.

(3), (4), and (5) of FIG. 3 each shows an example, in which in measuring the measurement distance 303 between the edge locations 304 on both sides of the circular or elliptic pattern to be measured 301, the measurement region 302 is specified, respectively, with one circular, rectangular, square, and elliptic measuring cursor including the edges on both sides.

(6) of FIG. 3 shows an example, in which in measuring the measurement distance 303 of the measurement region 302 between two circular patterns, the measurement region 302 including the respective edges is specified with a sectoral measuring cursor.

(7) of FIG. 3 shows an example, in which in measuring the measurement distance 303 between the edge locations 304 on both sides of the pattern to be measured 301 that is the subject to be measured, in order to measure a distance 307 between peaks 306 of two pieces of signaling information corresponding to the edge locations 304 of a pattern using signaling information 305 obtained from the pattern to be measured 301, the measurement region 302 is specified with one rectangular measuring cursor including the peaks 306 of two pieces of signaling information.

[Example of Occurrence of Process Fluctuation]

Figure 4:
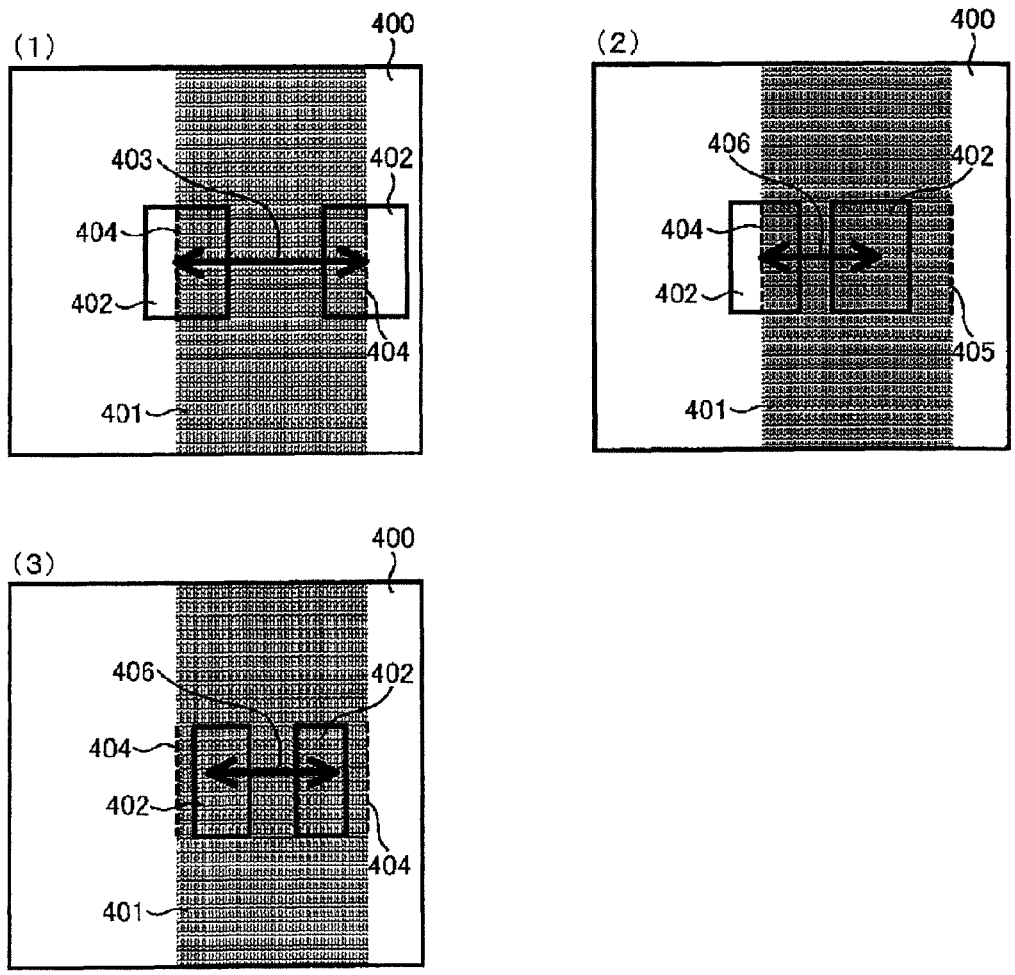
FIG. 4 is the view showing an example of the occurrence of a process fluctuation in a linear pattern and an example of predicted erroneous measurement.
Figure 5:
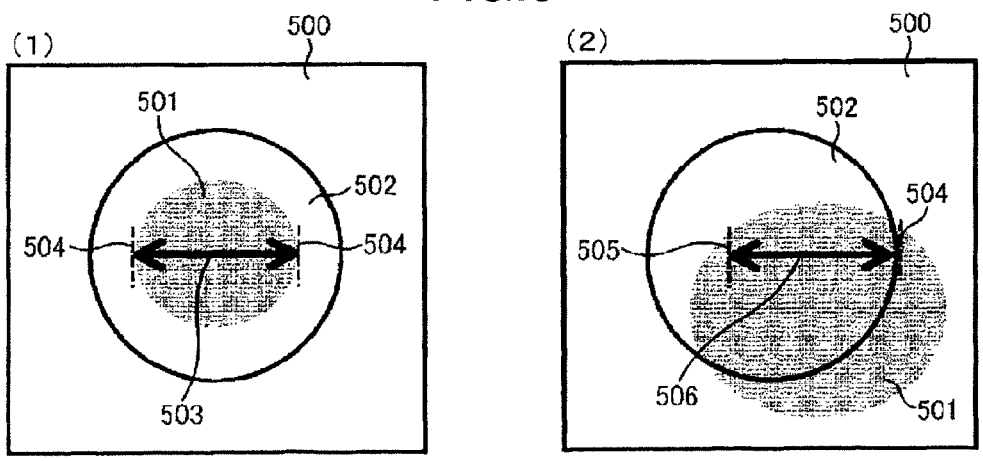
FIG. 5 is the view showing an example of the occurrence of a process fluctuation in a circular pattern and an example of predicted erroneous measurement.

FIG. 4 and FIG. 5 show an example of the occurrence of a process fluctuation between data, such as the design data, of a sample, such as a semiconductor device, and an SEM image obtained by imaging the sample. In this case, being unable to measure a pattern to measure or having detected a wrong location causes erroneous measurement of a pattern.

(1) of FIG. 4 shows an example, in which a measurement region 402 is correctly set when a pattern to be measured 401 on image data 400 becomes wider and shifts to the right side. Here, in order to calculate a correct measurement distance 403, the measurement region 402, including the left and right edge locations 404 to measure, needs to be set with a measuring cursor, as shown in the view.

(2) of FIG. 4 shows an example, in which only either one of the right and left edge locations is set as the measurement region 402, in contrast to the pattern to be measured 401 of (1) of FIG. 4. In this case, because an edge location 405 of a portion not included in the measuring cursor is not measured, erroneous measurement occurs in measuring a measurement distance 406.

(3) of FIG. 4 shows an example, in which the measurement region 402 is set based on the center of gravity of the pattern, in contrast to the pattern to be measured 401 of (1) of FIG. 4. In this case, the both left and right edge locations 404 are not included in the measurement region 402 and thus erroneous measurement, i.e., measuring a wrong measurement distance 406, occurs.

(1) of FIG. 5 shows an example, in which a measurement region 502 is correctly set relative to a pattern to be measured 501 in the center on image data 500. Here, in order to calculate a correct measurement distance 503, a region including left and right edge locations to measure 504 needs to be measured with a measuring cursor, with respect to the measurement region 502, as shown in the view.

(2) of FIG. 5 shows an example, in which only either one of the edge locations 504 is set as the measurement region 502 when the shape of the pattern to be measured 501 of (1) of FIG. 5 becomes larger and shifts to the right side. In this case, because an edge location 505 of a portion not included in the measuring cursor is not measured, erroneous measurement occurs in measuring a measurement distance 506.

As the way to manage the above-described process fluctuations, it is possible to set the measurement region wider, but when noises, such as another pattern that is not the subject to be measured, and dirt, are present in the periphery of a pattern to be measure, the erroneous measurement, i.e., erroneously measuring the noise, may occur.

Note that, a pattern to serve as a subject to be measured in this step or a pattern present therearound that is not a subject to be measured may fluctuate in size to a certain extent or be allowed to contact to a neighboring pattern, for example, in the case where it is removed in the next or subsequent step. In such a case a significant process fluctuation is expected to occur.

Embodiment 1

[Setting of Region Not to be Measured]

Figure 6:
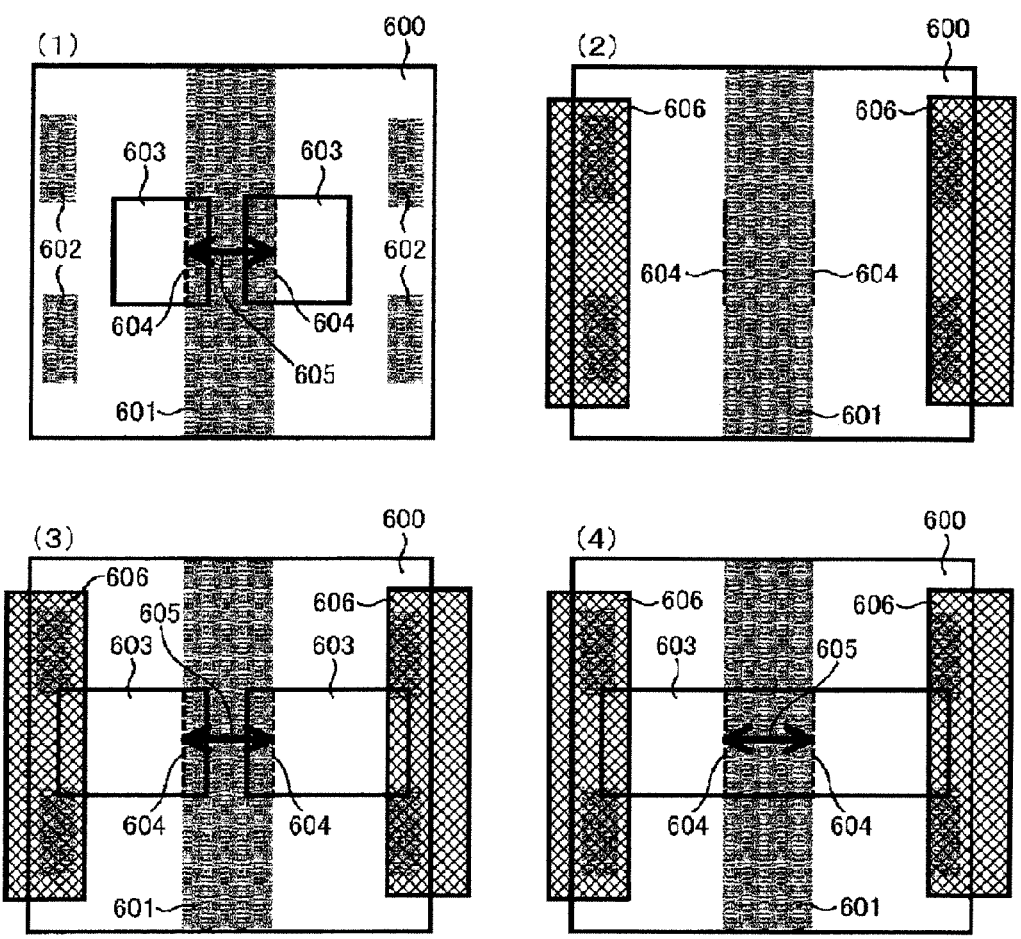
FIG. 6 is the view showing an example of setting a region not to be measured in a linear pattern.

Using FIG. 6, a method is described for setting, as a region not to be measured 606, a region including patterns 602 not used in measurement among a plurality of patterns to be measured 601 and 602 on image data 600. Here, the region not to be measured 606 can be set from various types of data, such as the previously stored pattern data 106, i.e., design data, simulation data, a reference image, and signaling information obtained from a measurement pattern.

(1) of FIG. 6 shows an example, in which among a plurality of patterns on the image data 600, without setting the region not to be measured 606, a measurement region 603 is set with a measuring cursor, with respect to the pattern to be measured 601 that is used in measurement, and then a distance 605 between the right and left edge locations 604 is measured.

At this time, if a measurement region is set wide as the way to manage the case where a process fluctuation occurs, then inclusion of a pattern 602, which is present in the periphery and is not used in measurement, may cause erroneous measurement.

(2) of FIG. 6 shows an example, in which a region including the pattern not used in measurement among a plurality of patterns on the data 600 is set as a region not to be measured 606. The pattern 602 included in the set region not to be measured 606 shall not be used in measurement. Next, as shown in (3) and (4) of FIG. 6, the measurement region 603 is set so that the edge locations 604 on both sides of the pattern used in measurement are included. At this time, a region is predicted where the pattern to be measured 601 that is used in measurement may vary due to a process fluctuations, and the measurement region 603 is set wide so that the left and right edge locations 604 used in measurement are included in the measurement region 603 even when a process fluctuation occurs. With this countermeasure, even when the size or location of the measuring cursor is modified as the way to manage the process fluctuation shown in FIG. 4, it is possible to stably measure a pattern without causing the erroneous measurement due to the influence of noises, such as a pattern that is not used in measurement, and dirt, in the periphery.

Embodiment 2

Figure 7:
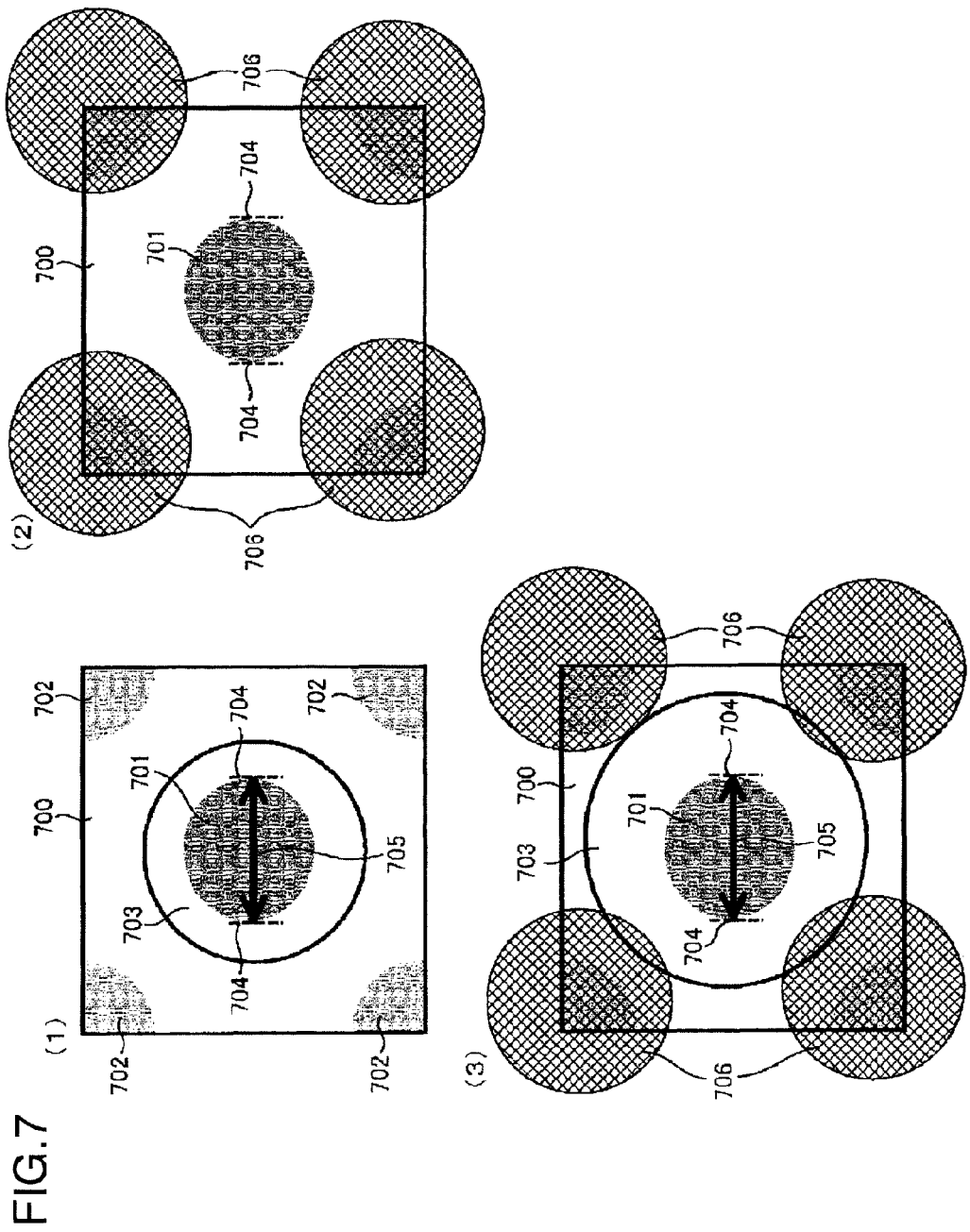
FIG. 7 is the view showing an example of setting a region not to be measured in a circular pattern.

FIG. 7 illustrates a method for setting, as a region not to be measured 706, a region including a pattern 702 not used in measurement among a plurality of circular patterns on image data 700. (1) of FIG. 7 shows an example, in which among a plurality of circular patterns on the data 700, without setting a region not to be measured 706, a measurement region 703 is set with a measuring cursor, with respect to the pattern to be measured 701 that is used in measurement, and then a distance 705 between right and left edge locations 704 is measured.

At this time, if a measurement region is set wide as the way to manage the case where a process fluctuation occurs, then inclusion of a pattern 702, which is present in the periphery and is not used in measurement, may cause erroneous measurement.

(2) of FIG. 7 shows an example, in which among a plurality of patterns on the image data 700, a region including a pattern 702 not used in measurement is set as a region not to be measured 706. The pattern 702 included in the set region not to be measured 706 shall not be used in measurement. Next, as shown in (3) of FIG. 7, a measurement region 703 is set so that edge locations 704 on both sides of the pattern are included. At this time, a region is predicted where the pattern to be measured 701 that is used in measurement may vary due to a process fluctuations, and then the measurement region 703 is set wide so that the left and right edge locations 704 used in measurement are included in the measurement region 703 even if a process fluctuation occurs. This operation may be carried out in setting the measurement condition at the time of pattern registration/detection or may be carried out when a pattern is actually measured. With this countermeasure, as the way to manage the process fluctuation shown in FIG. 5, it is possible to stably measure a pattern without causing the erroneous measurement due to the influence of noises, such as a pattern that is not used in measurement, and dirt in the periphery.

Embodiment 3

FIG. 8 shows a setting example of various conditions at the time of pattern registration/detection and a process flow in the present invention. This processing is an example of a case where prior to carrying out actual pattern matching and/or pattern measurement, a region not to be measured is set in advance as the information to be input, from a pattern on data such as design data related to a sample such as a semiconductor device. That is, this is a processing example, in which the setting of a region not to be measured, which is carried out after pattern matching in the pattern measuring apparatus shown in FIG. 1, is carried out in advance in setting the condition.

First, various conditions related to the pattern matching and pattern measurement are set. The processings, such as setting of imaging conditions in a low magnification to a high magnification, focusing, and alignment, are repeatedly carried out, in advance, to adjust so that a pattern to be measured comes in the field of view. If as the prior information there is information on the place of a portion with a large process fluctuation and the place of a portion with a small process fluctuation in the periphery of a location to be measured or information on how much a pattern is deformed by a process fluctuation, the setting of measurement condition becomes easier.

In this example, assume that among a plurality of patterns on image data 800 shown in (1) of FIG. 8, a pattern to be measured 801 in the center is a subject to be measured and the pattern width thereof is expected to significantly fluctuate. In contrast, for a pattern 802 in the periphery, assume that there is less fluctuation in its size and shape, and that the 802 is in a region with a small process fluctuation. In this example, because the pattern to be measured 801 in the center with a large process fluctuation is a subject to be measured, first as shown in (2) of FIG. 8 the pattern 802 in the periphery, which is not a subject to be measured, with a small process fluctuation is masked and excluded from the subjects to be measured. Next, as shown in (3) of FIG. 8, the measurement condition and the measurement region are set (in this example, the width of a line is measured). Here, the measurement region is set large so that the pattern is within the measurement region even if a process fluctuation occurs. For the size of the measurement region, if a region not to be measured is appropriately set, the measurement region may be set a little larger so that the region not to be measured overlaps with the measurement region. Subsequently, a pattern used in pattern matching is set. Here, the pattern 802 in the periphery with a small process fluctuation is preferably selected. At this time, as shown in (4) of FIG. 8, so as not to be affected by a process fluctuation or the like of the pattern to be measured 801 in the center that is not used in pattern matching, only the region including the pattern to be measured 801 in the center with a large process fluctuation may be set as the region not to be measured 803 by using the entire screen.

All the information, such as a measurement image, a measurement condition, a region used in measurement, and a region to be masked, are associated with each other and stored in advance.

Embodiment 4

Figure 9:
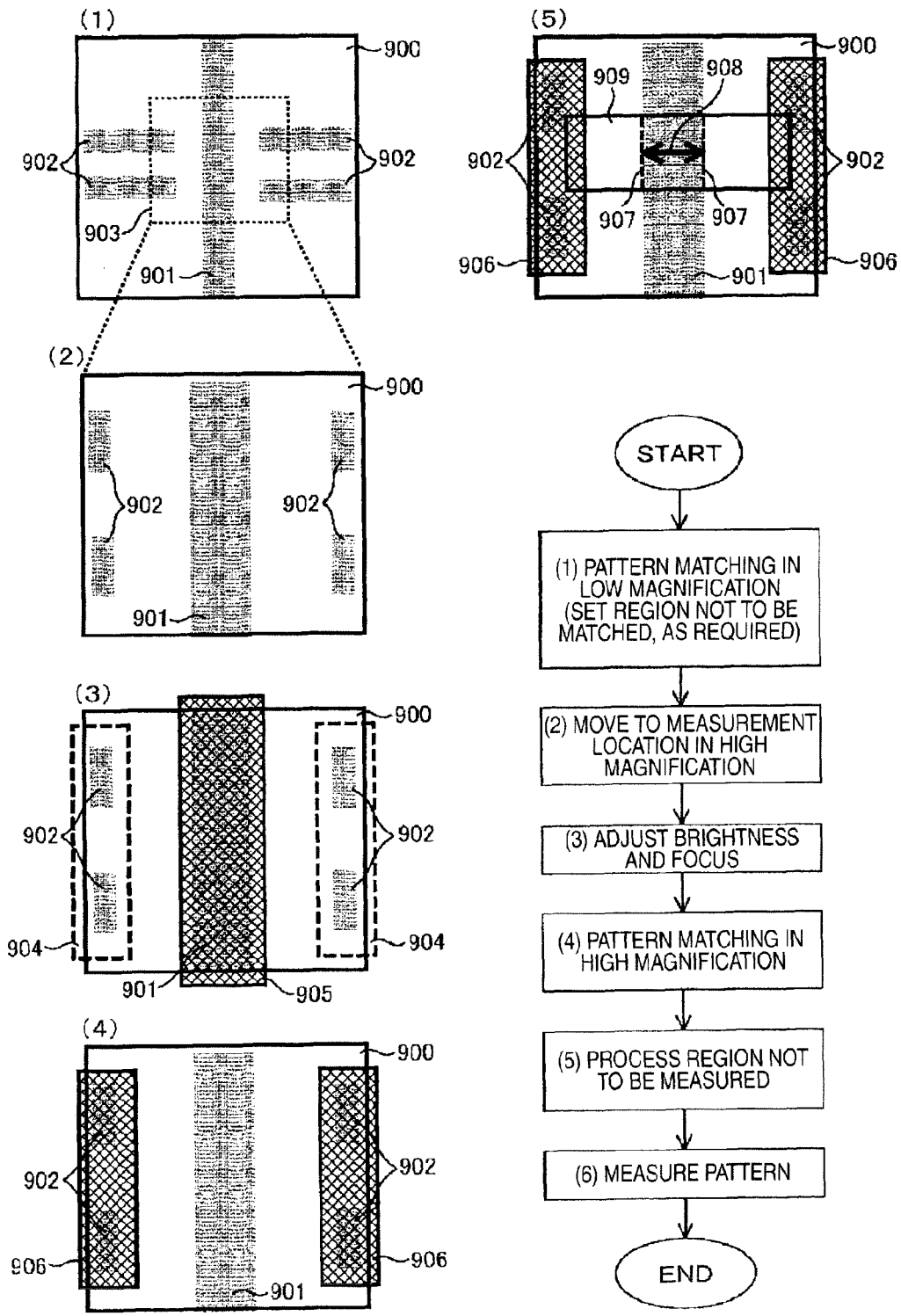
FIG. 9 show an operation example and a process flow when pattern matching and pattern measurement are actually carried out based on an imaging condition input in the present invention.

FIG. 9 shows an example of the process flow in actually carrying out pattern matching and pattern measurement based on FIG. 6 to FIG. 8 and on the conditions registered according to the above-described procedure. As the process, the following sequence can be contemplated.

(1) Align in a low magnification.
(2) Move to a measurement location in a high magnification.
(3) Adjust brightness and focus.
(4) Pattern matching in a high magnification.
(5) Process a region not to be measured.
(6) Measure a pattern.

Basically, based on the condition setting at the time of the above-described pattern detection/registration, pattern matching and pattern measurement are carried out in a sample, such as a semiconductor device to serve as a subject to be measured. Hereinafter, the pattern matching and pattern measurement are described using the above sequence and FIG. 9 in order.

In (1) of FIG. 9, alignment is carried out in a magnification lower than a measurement magnification. Here, in carrying out alignment, it is recommended to use a portion with a small process fluctuation among a plurality of line patterns on image data 900. In an example of FIG. 9-(1), a pattern to be measured 901 with a large process fluctuation in the center of a screen is set to a subject to be measured. At this time, a pattern 902 with a small process fluctuation present in a measurement region around the pattern to be measured 901 is set to a subject to be aligned in a magnification of an approximately half the magnification at the time of measurement. Subsequently, in (2) of FIG. 9, move to a measurement location (a region surrounded by a dotted line 903 of (1) of FIG. 9) in a high magnification, and in (3) of FIG. 9 the brightness and/or focusing are adjusted, as required, to obtain a focused image in the measurement magnification. Here, in (4) of FIG. 9, pattern matching in a high magnification is carried out. Here, alignment is carried out using a region including the pattern 902 in the periphery with a small process fluctuation surrounded by a dotted line. At this time, as required, as shown in (3) of FIG. 9, a region including the pattern to be measured 901 in the center with a large process fluctuation may be set as a region not to be matched 905. In (5) of FIG. 9, a region not to be measured 906 that is registered in advance with the above-described method is processed. As shown in (4) of FIG. 9, here, the pattern 902 in the periphery used in pattern matching corresponds to the region not to be measured 906. In (6) of FIG. 9, the subject to be measured is the pattern to be measured 901 with a large process fluctuation located in the center of the screen, and therefore by setting a measurement region 909 a little wider as shown in (5) of FIG. 9, stable measurement corresponding to a process fluctuation can be carried out with respect to a distance 908 between edge locations 907 on both sides of a line pattern in the center.

Moreover, the pattern matching and the pattern measurement do not need to be carried out in the same magnification and in the same field of view, and thus execution of the pattern matching in a lower magnification also allows the use of information in a wide field of view. In carrying out the measurement with an apparatus with a poor positional accuracy or in a higher magnification, it is recommended to carry out the pattern matching in a low magnification.

Moreover, setting such as the following may be carried out; alignment is carried out in a low magnification prior to the measurement, and then based on this information the alignment is again carried out in a magnification close to a magnification used in carrying out pattern measurement, so that an inspection pattern comes in the field of view in the measurement/inspection magnification.

Embodiment 5

Figure 10:
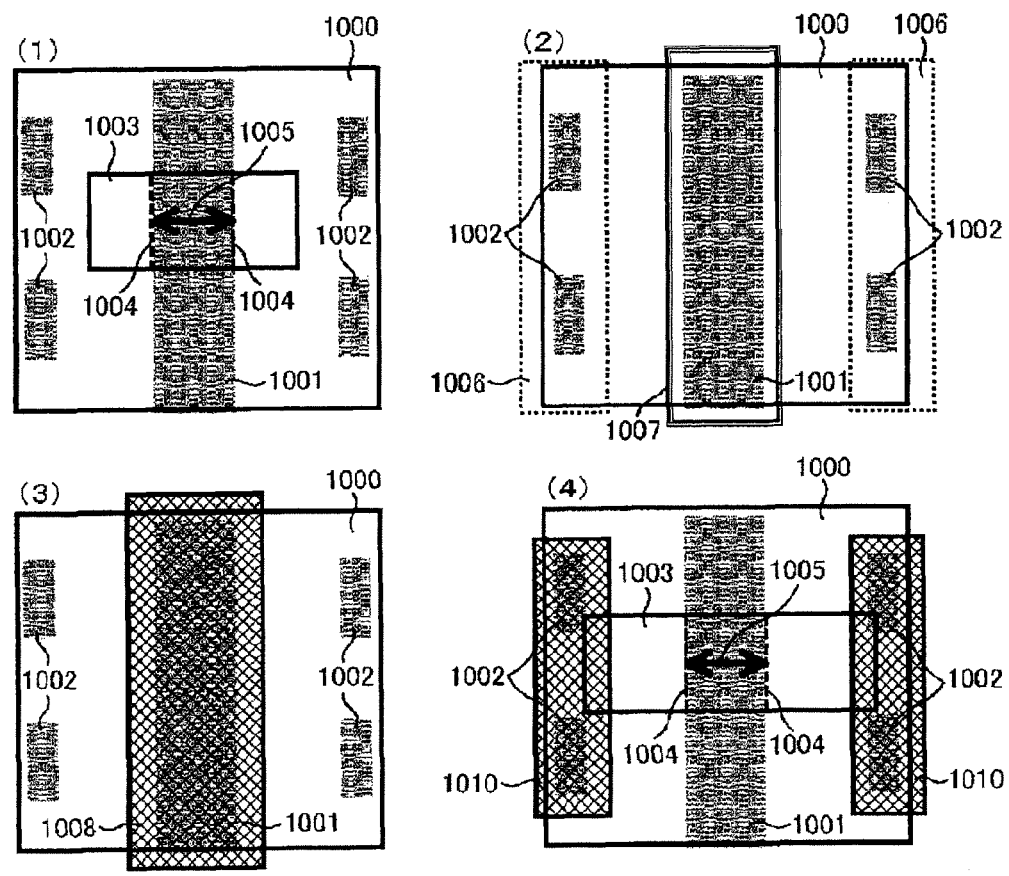
FIG. 10 shows an operation example when a region not to be matched or/and a region not to be measured are set in actually carrying out pattern matching and pattern measurement in the present invention.

Next, using FIG. 10, a case is described where in the stage of actually carrying out the pattern matching and pattern measurement, taking into consideration a process fluctuation in a plurality of patterns on image data, the setting and processing of a region not to be matched, a region not to be measured, and a measurement region are carried out.

As shown in (1) of FIG. 10, a region including edge locations 1004 on both sides of a pattern to be measured 1001, which is expected to have a process fluctuation, on image data 1000 is set to a measurement region 1003.

Here, first, an example of setting a region not to be matched 1008 in carrying out pattern matching in a high magnification is shown. As shown in (2) of FIG. 10, from foresight information, a place where a change in shape due to a process fluctuation may occur and a place where it doesn't occur are distinguished. For example, this can be predicted from a forming state in a process or from the existing inspection result. Moreover, also in cases where the allowable size value with respect to a process is large, a process fluctuation is more likely to occur. In this example, assume there is foresight information as follows: a pattern to be measured 1001 located in the center of the screen is a subject to be measured but a process fluctuation is most likely to occur here and a line pattern 1002 in the periphery of the screen is not a subject to be measured but a process fluctuation is less likely to occur. Here, a region, as surrounded by a double line, where the probability of occurrence of a process fluctuation is high, and a region, as surrounded by a dotted line, where the probability of occurrence of a process fluctuation is low, are distinguished.

For example, in the case of pattern detection, as shown in (3) of FIG. 10, the periphery of a line pattern in the center of the screen where the probability of occurrence of a process fluctuation is high is set as the region not to be matched 1008, and the pattern matching is carried out using only the information on the pattern 1002 in the periphery where the probability of occurrence of a process fluctuation is low. The pattern matching in this case may be carried out with the entire screen as a template after setting the pattern to be measured 1001 as the region not to be matched 1009, or may be carried out with a part thereof as a template after setting the entire screen as the region not to be matched (not shown). The setting of this region not to be matched is not necessarily carried out, but is preferably carried out as required taking into consideration the influence of a process fluctuation.

In the example of FIG. 10, the pattern to be measured 1001 with a large process fluctuation is the subject to be measured, and therefore when the pattern measurement or the like is carried out after pattern matching is complete, as shown in (4) of FIG. 10, the pattern 1002 in the periphery with a small process fluctuation is set as a region not to be measured 1010, as opposed to at the time of pattern matching, and the pattern measurement is carried out in a measurement region 1008. As shown in (5) of FIG. 10, it is also possible to set, as a region not to be measured 1010, all the portions except the portion of the measuring cursor.

As shown in FIG. 10, the region not to be matched, the region not to be measured, and the measurement region are set with respect to a plurality of patterns on data according to the magnitude of a process fluctuation whereby the pattern matching may be carried out using only a region including a pattern with a small process fluctuation and the pattern measurement may be carried out using only a region including a pattern with a large process fluctuation. If a pattern with a small process fluctuation is set to a subject to be measured, the respective pattern matching and pattern measurement may be carried out using only a region including a pattern with a small process fluctuation.

Embodiment 6

Figure 11:
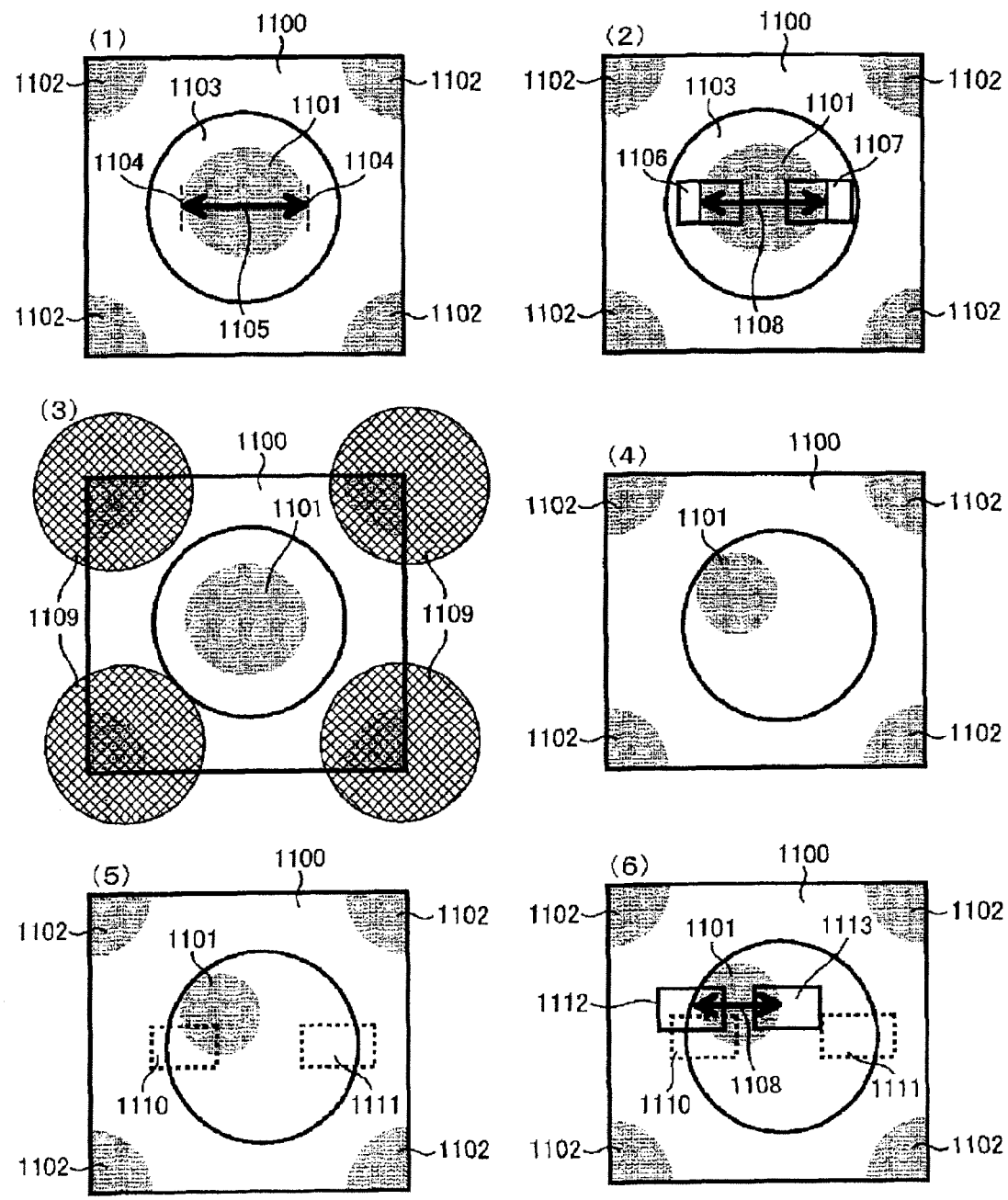
FIG. 11 is the view showing an operation example in setting, to a circular pattern, a measurement region a plurality of times and carrying out pattern matching and pattern measurement in the present invention.

FIG. 11 shows an example of the pattern matching and pattern measurement using a plurality of templates with respect to a plurality of patterns on image data 1100. Hereinafter, a specific method is described.

In measuring a distance 1105 between edge locations 1104 of a circular pattern on the image data 1100 as shown in (1) of FIG. 11, when a process fluctuation occurs in a pattern to be measured 1101 as shown in (4) of FIG. 11, a processing to correct the location of a measuring cursor including a measurement reference location in the measurement region is required.

(1) of FIG. 11 shows an example of setting a pattern to be measured and a measurement region. As shown in (2) of FIG. 11, in a pattern to be measured 1101 on the image data 1100, measuring cursors 1106 and 1107 including a reference location for pattern measurement is set as (rmr) and (rml), respectively. Moreover, a distance 1108 (rdm) between rml and rmr is stored in advance as the information at the time of registration.

As shown in (3) of FIG. 11, a region not to be measured that is not used in pattern measurement may be set. This procedure may not be set, but is preferably carried out, as required, taking into consideration the influence and the like of a process fluctuation.

Next, a pattern to be measured 1101, the size of which varied with a process fluctuation, as shown in (4) of FIG. 11 is set to a subject to be measured.

If pattern matching is carried out using a general approach, such as normalized correlation, then, for example, as shown in (5) of FIG. 11, it is contemplated that the pattern to be measured 1101 is detected at a location where a part thereof overlaps with a pattern on a SEM image 1113. That is, the arrangement of the measuring cursors 1110 (trml) and 1111 (trml) becomes relative to the location of the pattern to be measured 1101 at the time of pattern registration in the previously stored pattern data. In the example of (5) of FIG. 11, in particular in the measuring cursor (trml) on the right, there is no edge to serve as a subject to be measured. The measuring cursor (trml) on the left is also arranged below the location of the edge that should be originally measured, and if pattern measurement is carried out as it is, a measurement error or erroneous measurement is most likely to occur.

Then, as shown in (6) of FIG. 11, with the measuring cursors 1110 (trml) and 1111 (trml) as a template, more detailed pattern matching is carried out with respect to the pattern whose size varied. An approximate location is already predicted in the condition setting at the time of pattern registration in (1) to (3) of FIG. 11 in the previous stages, and therefore in this stage, the detection only in the periphery of the measuring cursor 1110 (trml) and the measuring cursor 1111 (trml) may be carried out.

The pattern matching is carried out by the processing of (6) of FIG. 11, and the detected new measuring cursor locations are denoted by 1114 (rml') and 1115 (rmr') and the distance therebetween is denoted by 1118 (rdm'), and then pattern measurement is carried out.

An index value of a process fluctuation between previously stored pattern data and the image data of a sample is expressed by Formula below.

Process variation index value $pd = dm'/rdm$ (1)

The index value can be expressed as Formulas below, respectively, when a subject to be measured is two-dimensional.

$$pdx = rdmx'/rdmx \qquad (2)$$

$$pdy = rdmy'/rdmy \qquad (3)$$

$$pd = \sqrt{(rdx * rdx + rdy * rdy)} \qquad (4)$$

Based on this index value, the location and size of the measuring cursors of rmrx' and rmry' can be also corrected.

Embodiment 7

Using FIG. 12, an example of a procedure for automatically setting a region not to be matched corresponding to various process fluctuations in the case of using an actual image is shown. Here, an example using a reference image as data related to a sample is shown, but this approach can be applied also to various types of data, such as design data, a simulation image, and the signaling information corresponding to measurement pattern information.

In order to set a region not to be matched, a plurality of sets of sample images (hereinafter, each set of sample images is referred to as an "image set") supposed to be appropriately applied to assumed various process fluctuations are prepared. A plurality of image sets, the shape of each of which actually varied and which cover a range of assumed process fluctuations, can be preferably prepared, but the setting may be carried out taking into consideration the foresight information of a user.

This processing can be manually carried out if the number of image sets is small, but taking into consideration the case where the number of image sets increases, this processing is recommended to be automated.

With (1) of FIG. 12 as a reference image, examples of an assumed process fluctuation are shown. The following cases are assumed: a case where the line width is wide as compared with a pattern to be measured 1201 of the reference image ((2-1) of FIG. 12); a case where it is narrow ((2-2) of FIG. 12); a case where a white band is wide ((2-3) of FIG. 12), note that this is indicated by a black thick line); a case where another pattern, such as dirt, is present around a measurement pattern ((2-4) of FIG. 12); and the like. Note that these examples individually occur or these examples simultaneously occur.

These images are prepared as input information, and a line pattern 1202 portion in the periphery with a particularly small process fluctuation of a reference image is set as a template, and the pattern matching is carried out. (3-1) to (3-4) of FIG. 12 each shows an example of setting a region not to be matched 1208. The pattern matching may be carried out without setting the region not to be matched 1208. However, in the case of matching using a correlation value, when the brightness of a portion with a large process fluctuation is high, the matching may not be correctly carried out due to being largely affected by this portion. Therefore, the region not to be matched 1208 is more preferably set. Because this processing needs to be manually carried out, an image with various process fluctuations in an image set needs to be uniformly extracted. With the above-described processing, the pattern matching in a region including the pattern 1202 in the periphery with a small process fluctuation can be carried out to calculate the amount of positional deviation of each image of an image set.

Figure 13:
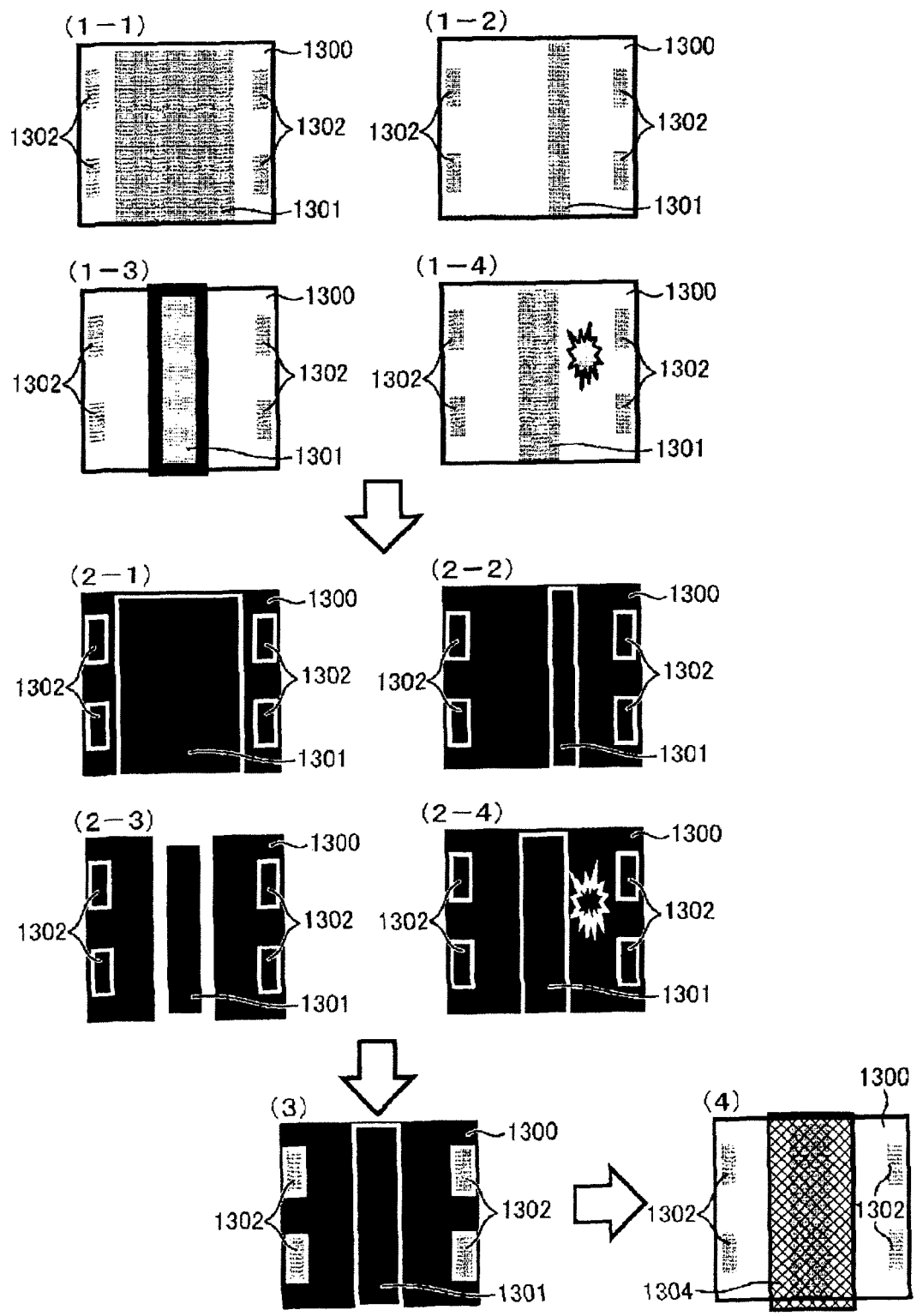
FIG. 13 is the view showing an example of calculating a pattern appearance probability map with respect to various patterns and setting a region not to be matched using the same.

Next, as shown in FIG. 13, the appearance probability of a pattern at each location in an image is calculated.

With respect to the above-described image set shown in (1-1) to (1-4) of FIG. 13, noise rejection processing or binarization processing is carried out as shown in (2-1) to (2-4) of FIG. 13 to extract a pattern. Here, the processing of the known Otsu's binarization or the like may be applied, or taking into consideration noises in an image, the noise rejection processing, to which a Gaussian filter or the like is applied, may be additionally applied. Each binarized image is added taking into consideration the above-described amount of positional deviation. By this addition, a pattern appearance probability map is prepared as shown in (3) of FIG. 13. First, for an image set, the amount of positional deviation between sample images is calculated in advance. The existing alignment method may be used or the alignment may be carried out visually. Based on the information of the amount of positional deviation between the binarized image that is prepared using the above-described approach and the calculated image, an average image after binarization is prepared. This image is the pattern appearance probability map. In (3) of FIG. 13, assume that a pattern to be measured 1301 has a low appearance probability and a pattern 1302 in the periphery has a high appearance probability.

Figure 14:
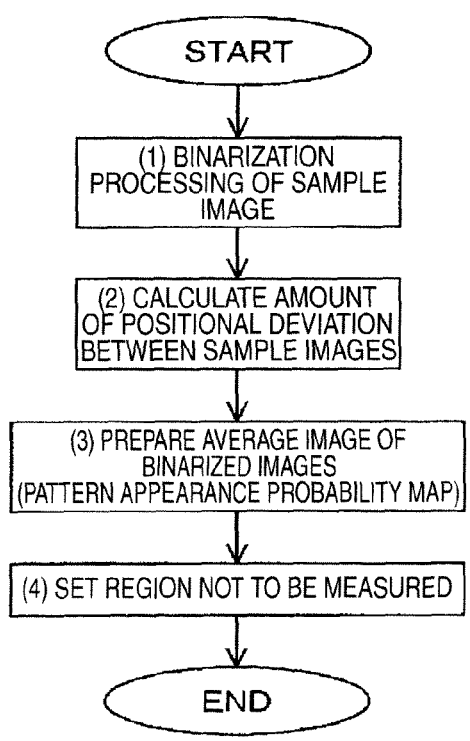
FIG. 14 is the view showing the process flow of the setting example of FIG. 13.
Figure 15:
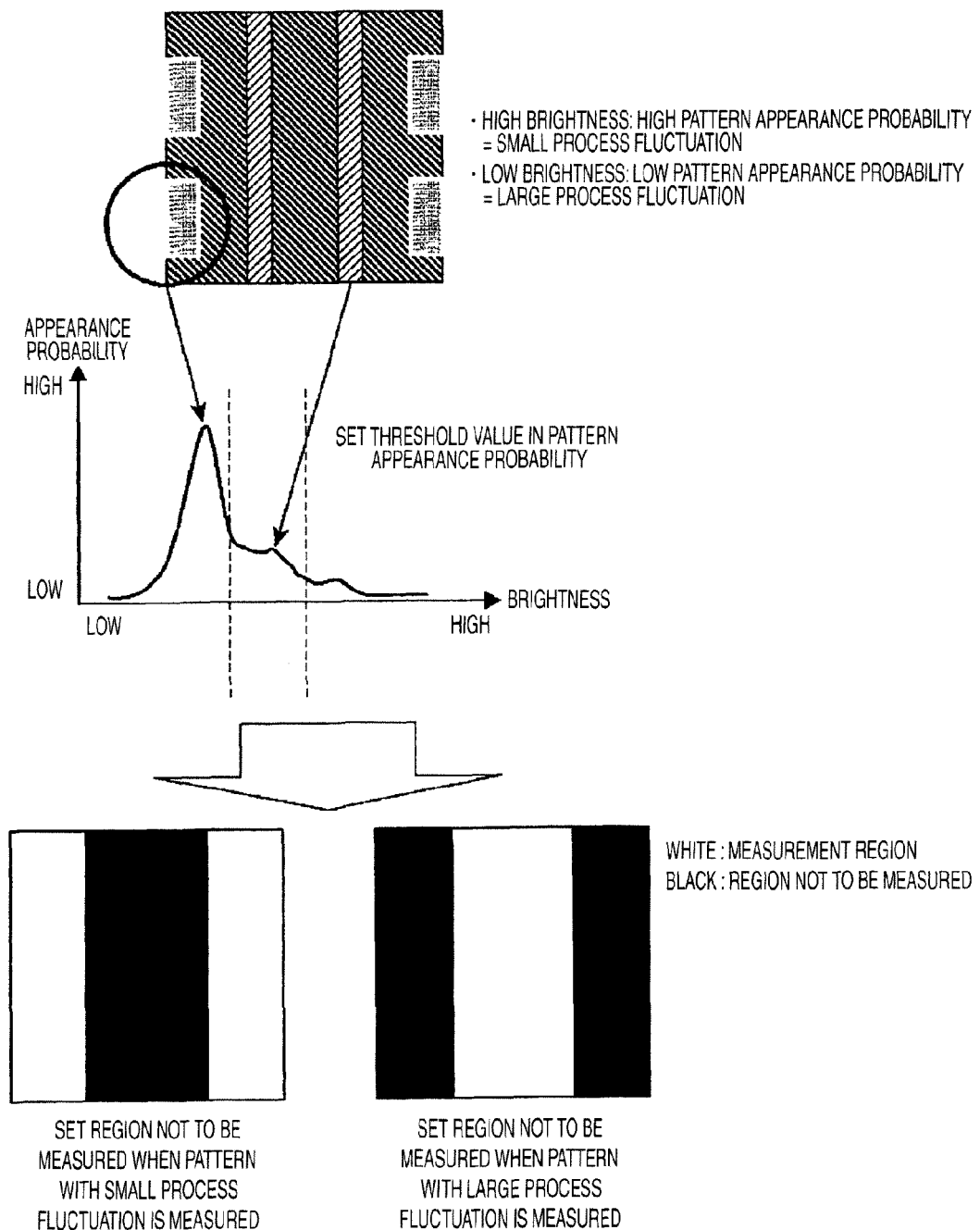
FIG. 15 is the view showing a use example of a threshold value using a pattern appearance probability map in setting a region not to be matched or/and a region not to be measured.

From the pattern appearance probability map prepared using the above-described approach, a region not to be matched 1304 is manually or automatically set as shown in (4) of FIG. 13 depending on application. FIG. 14 is an example of the above process flow that was described using FIG. 13. At this time, when a threshold value is set to the appearance probability of a pattern and for example a pattern with a large process fluctuation is set to a subject to be measured, a measurement region can be also identified by setting a portion with the appearance probability smaller than the threshold value to a region not to be measured. To the contrary, when a pattern with a small process fluctuation is desired to be detected, a portion with a process fluctuation larger than the threshold value may be set as a region not to be matched (or a region including a pattern with a small process fluctuation is specified as the matching region). FIG. 15 shows a use example of a threshold value in setting a region not to be matched or a region not to be measured. The threshold value may be externally set or may be automatically set using the Otsu's binarization processing or the like. The examples of a simple approach include a method of preparing a histogram of binarized average images and from this information, setting the threshold value, and the like.

Embodiment 8

Other than this, an example of application to the case where the spacing between a pattern with a large process fluctuation and a pattern with a small fluctuation is measured is described below using FIG. 16.

Assume that with the above-described approach, a portion with a high appearance probability of a pattern and a portion with a low appearance probability of a pattern are already distinguished. Needless to say, without using the above-described approach in particular, large and small process fluctuations may be distinguished from the foresight information of a user, for example.

Figure 16:
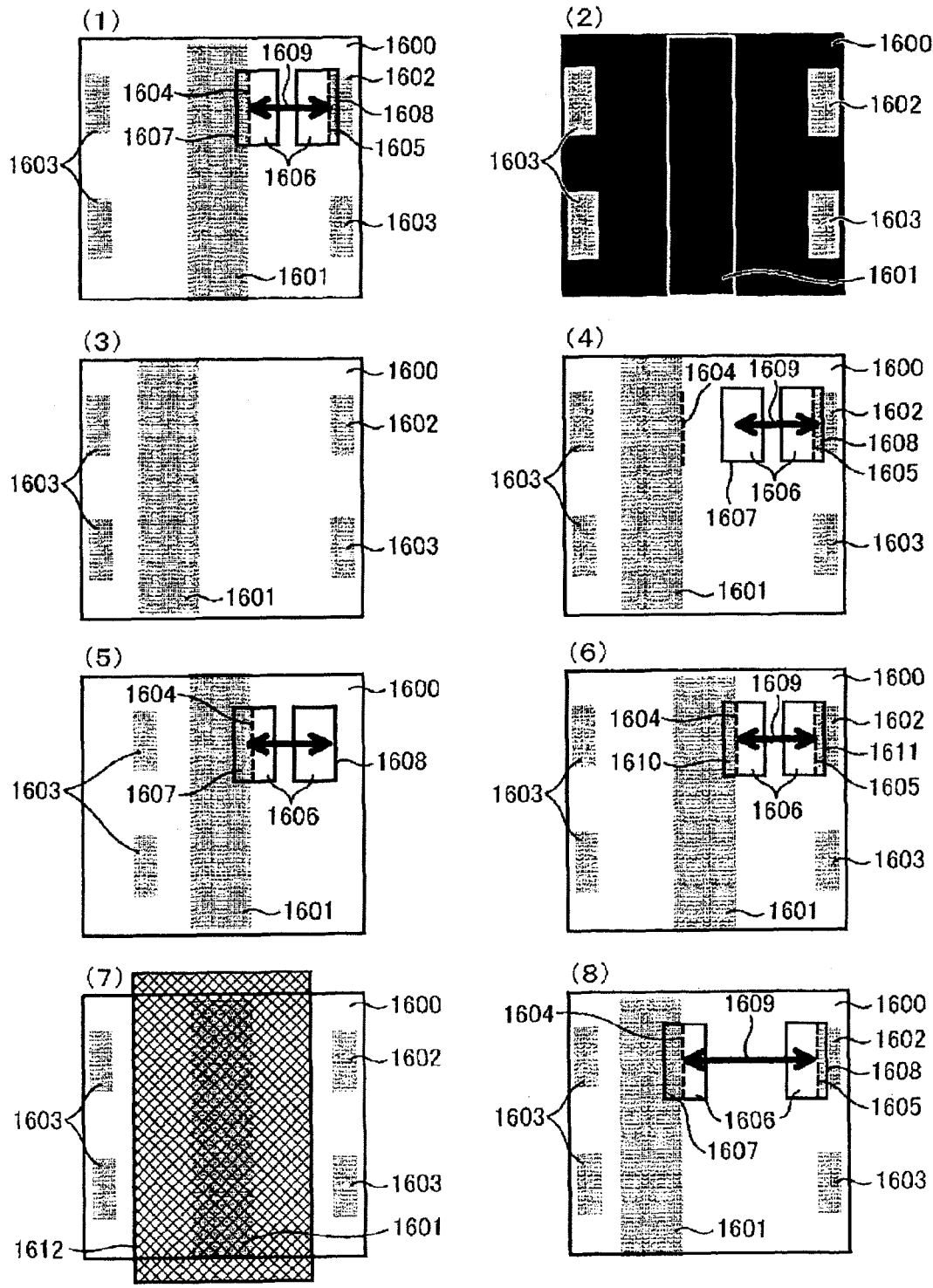
FIG. 16 is the view showing an example of applying the present invention to a case where a spacing between a pattern with a high probability of occurrence of a process fluctuation and a pattern with a low probability of occurrence of a process fluctuation is measured.

A pattern to be measured and a measurement region are shown in (1) of FIG. 16. Among a plurality of patterns on data 1600, a pattern to be measured 1601 and an upper right pattern 1602 are set to the subjects to be measured and a region including an edge 1604 on the right side of a line pattern in the center and an edge 1605 on the left side of an upper right line pattern are set to a measurement region 1606, respectively.

Among the set regions to be measured 1606 on both sides, a portion used in pattern measurement is set to measuring cursors 1607 (rml) and 1608 (rmr), respectively, and a measurement distance 1609 (rdm) therebetween is measured. A pattern appearance probability map of this example is shown in (2) of FIG. 16. In this case, the pattern to be measured 1601 in the center of the screen has a high probability of occurrence of a process fluctuation and has a low appearance probability of a pattern. On the other hand, the line patterns 1602 and 1603 in the periphery each have a low probability of occurrence of a process fluctuation and have a high appearance probability of a pattern. (3) of FIG. 16 shows an example of an actual measurement image. In the measurement image, the pattern to be measured 1601 near the center of the screen is shifted to the left side of the screen as a positional relation with respect to the periphery thereof. Assume the line width is substantially the same.

If in (3) of FIG. 16 pattern matching is carried out with reference to the patterns 1602 and 1603 and the measurement region 1606 is set, then an edge location 1604 to be measured is not within a measuring cursor 1607 (rml) as shown in (4) of FIG. 16. Moreover, if pattern matching is carried out with reference to the line pattern 1601 in the center of the screen as shown in (5) of FIG. 16 and the pattern to be measured 1601 is adjusted so as to come in the center of the screen and set a measurement region, then the pattern 1602 which is supposed to be present within a measuring cursor 1608 (rmr) and which should have been present at the right edge of the screen is not present and thus erroneous measurement occurs. An example for alleviating the above-described problem is shown below. First, at the time of setting the measurement condition, as shown in (6) of FIG. 16 from the information on a reference image, the information on a set measurement region is stored in advance as templates 1610 (trml) and 1611 (trml). At this time, if with the use of a pattern appearance map or foresight information, a portion with a large process fluctuation is set in advance as a region not to be matched, then more stable pattern matching is possible. Moreover, a region that is not used in pattern measurement may be set as a region not to be measured, using the above-described approach.

Next, pattern matching is carried out. This may be carried out with an ordinary method, but as shown in (7) of FIG. 16, preferably a region not to be matched is set and the pattern detection is carried out with the patterns 1602 and 1603 in the periphery with a small process fluctuation as a template. The pattern to be measured 1601 in the center with a particularly large process fluctuation may be set as a template. However, because both the pattern to be measured 1601 in the center and the patterns 1602 in the upper-right of the screen, which finally serve as a subject to be measured, need to appear within the screen, the former approach may be used taking into consideration the influence of a process fluctuation.

Next, detailed pattern matching is carried out with respect to the measurement image. As the foresight information, the following facts are already known: the measuring cursor 1607 (rml) is present in a region including the pattern 1601 in the center with a small process fluctuation; and the measuring cursor 1608 (rmr) is present in a region including the pattern 1602 in the periphery with a small process fluctuation. Therefore, the measuring cursor 1608 (rmr) can be easily detected. Moreover, the following fact is also already known: the measuring cursor 1607 (rml) is present on the left of the measuring cursor 1608 (rmr), and as shown in (7) of FIG. 16 in carrying out pattern matching, it is present in a region set as a region not to be matched 1612 or in the periphery thereof.

Therefore, detection processing may be carried out by matching using ordinary correlation or the like. The distance information on rml/rmr here can be calculates as a process fluctuation index value with the above-described Formulas (1) to (4), and can serve as an index value for process control.

[Application Example of Setting Region not to be Measured]

Figure 17:
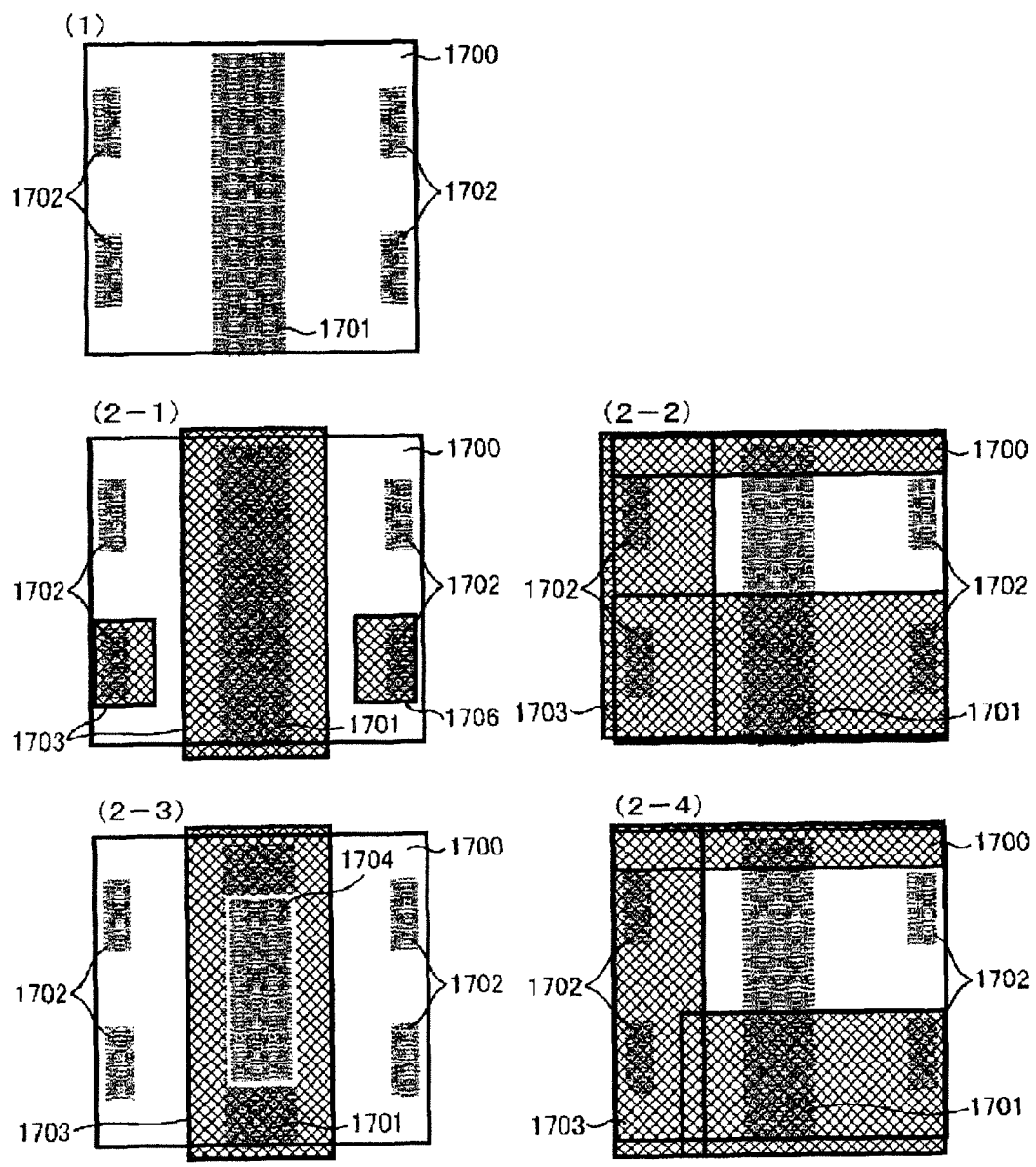
FIG. 17 is the view showing various examples of setting a region not to be measured.

FIG. 17 shows various setting examples of a region not to be measured. Assume, as shown in (1) of FIG. 17, a plurality of patterns are included on data 1700. (2-1) of FIG. 17 shows an example, in which among patterns 1702 in the periphery, only two upper ones are set as subjects to be measured, and the other line patterns thereunder and a line pattern 1701 in the center are set as regions not to be measured. (2-2) of FIG. 17 shows an example of setting, as the regions not to be measured, all the regions except the measurement region. Here, among a part of the pattern to be measured 1701 in the center and the patterns 1702 in the periphery, only the pattern present on the upper right is set to a subject to be measured and the other patterns are explicitly selected as the regions not to be measured and are set.

(2-3) of FIG. 17 shows an example of setting a measurement region in a region not to be measured. Here, a part of the pattern to be measured 1701 in the center is set to a subject to be measured. Although the same thing can be specified even when the region not to be measured is set at four upper and lower and left and right positions, respectively, the operation is simplified by allowing to select and set both the region not to be measured and the measurement region.

(2-4) of FIG. 17 shows an example of setting, as the measurement region, all the regions except the region not to be measured. Although (2-2) and (2-4) of FIG. 17 produce the same result, the operation can be simplified by explicitly specifying either one of the region not to be measured or the measurement region. For example, even if a region not to be measured is wide, specifying only a region not to be measured is easier when the region not to be measured can be set with one square. A region not to be measured and a measurement region are preferably selected with a simple method based on the number, shape, or the like of the regions not to be measured and the regions to be measured.

REFERENCE SIGNS LIST 100 pattern measuring apparatus; 101 measurement region setting unit; 102 "region not to be matched" setting unit; 103 pattern matching unit; 104 pattern measurement unit; 105, 109, 300, 400, 500, 600, 700, 800, 900, 1000, 1100, 1200, 1300, 1600, 1700 image data; 106 pattern data; 107 pattern matching result; 108 "region not to be measured" setting unit; 110 pattern measurement result; 200 scanning electron microscope system; 201 SEM; 202 image processing device; 203 display device; 204 control computer; 205 input unit; 207 image processing result; 208 SEM control data; 209 image processing data; 210 display data; 211 control data; 301, 401, 501, 601, 701, 801, 901, 1001, 1101, 1201, 1301, 1601, 1603, 1701 pattern to be measured; 302, 402, 502, 603, 703, 803, 909, 1003, 1103, 1206, 1606 measurement region; 303, 403, 406, 503, 506, 605, 705, 805, 908, 1005, 1105, 1205, 1609, 1116 measurement distance; 304, 404, 405, 504, 505, 604, 704, 804, 907, 1004, 1104, 1204, 1604, 1605 edge; 305 signaling information; 306 peak; 307 distance between a plurality of peaks corresponding to edge locations; 602, 702, 802, 902, 1002, 1102, 1202, 1302, 1602, 1702 pattern; 606, 706, 806, 906, 1010 1703 region not to be measured; 807, 905, 1109 1208, 1304 region not to be matched; 903, 904 matching region; 1006 region where process fluctuation is most likely to occur; 1007 region where process fluctuation is less likely to occur; 1106, 1107, 1110, 1111, 1607, 1608 measuring cursor; 1108 distance; 1112, 1113 newly set measuring cursor; 1207 noise components, such as dirt; 1704 measurement region set in region not to be measured

The invention claimed is:

1. A pattern measuring apparatus comprising:
a measurement region setting unit that sets a measurement region in image data obtained by imaging a sample, a pattern to be measured being formed on a sample, and the image data including data corresponding to the pattern;
a matching unit that performs pattern matching between the image data and previously stored pattern data;
a "region not to be measured" setting unit that sets, as a region to be excluded from subjects to be measured, a predetermined region in the image data aligned by the matching unit; and
a pattern measurement unit that extracts pattern image data included in the measurement region and obtains a dimension of the pattern formed on the sample based on the extracted pattern image data, wherein:
the pattern measurement unit carries out pattern measurement as to the extracted pattern image data included in the measured region, with excluding image data included in a region where the measurement region and the predetermined region overlap with each other, and
at least one of the above units is implemented by a processor.

2. The pattern measuring apparatus according to claim 1, wherein the pattern data is either of design data of the sample, simulation data, a reference image, or signaling information obtained from a measurement pattern.

3. The pattern measuring apparatus according to claim 1, wherein the predetermined region is set using the pattern data.

4. The pattern measuring apparatus according to claim 3, wherein the predetermined region is set using either of design data of the sample, simulation data, a reference image, or signaling information obtained from a measurement pattern.

5. The pattern measuring apparatus according to claim 1, wherein a pattern included in a predetermined region in the image data has a shape error from a corresponding pattern on the pattern data, the shape error being relatively smaller than a pattern included in a region excluding the predetermined region in the measurement region.

6. The pattern measuring apparatus according to claim 1, wherein a pattern included in a predetermined region in the image data has a shape error from a corresponding pattern on the pattern data, the shape error being smaller than a predetermined threshold value.

7. A scanning electron microscope system comprising:
an image processing device with the pattern measuring apparatus according to claim 1;
a scanning electron microscope;
a control computer controlling the scanning electron microscope and the image processing device;
an input unit configured to input at least a parameter for carrying out pattern matching and pattern measurement; and
a display device for displaying image data, a pattern matching result, and a pattern measurement result from the scanning electron microscope.

8. A pattern measuring method comprising:
a measurement region setting step of setting a measurement region in image data obtained by imaging a sample, a pattern to be measured being formed on a sample, and the image data including data corresponding to the pattern;

a matching step of carrying out pattern matching between the image data and previously stored pattern data;

a "region not to be measured" setting step of setting, as a region to be excluded from subjects to be measured, a predetermined region in the image data aligned by the matching step; and a pattern measurement step of extracting a pattern data included in the measurement region and obtaining a dimension of the pattern formed on the sample, based on the extracted pattern image data, wherein in the pattern measurement step, pattern measurement is carried out, with image data included in a region, where the measurement region and the predetermined region overlap with each other, being excluded.

9. A system comprising:

a computer for receiving at least one of image data of a scanning electron microscope and previously stored pattern data via a network or via an external connection type memory;

an input unit configured to input at least a parameter for carrying out pattern matching and pattern measurement;

a display device for displaying image data from the scanning electron microscope, a pattern matching result, and a pattern measurement result; and a non-transitory memory storing a program, wherein the program, when executed by the computer, causes the computer to perform the pattern measuring method according to claim 8.

10. A non-transitory memory storing a program, wherein the program, when executed by a computer, causes the computer to perform the pattern measuring method according to claim 8.

* * * * *